United States Patent [19]
Gontowski, Jr.

[11] 4,450,415
[45] May 22, 1984

[54] ALTERABLE MODE OSCILLATOR

[75] Inventor: Walter S. Gontowski, Jr., Thompson, Conn.

[73] Assignee: Sprague Electric Company, North Adams, Mass.

[21] Appl. No.: 296,749

[22] Filed: Aug. 27, 1981

[51] Int. Cl.³ .................... H03K 4/04; H03K 5/159; H03K 3/282

[52] U.S. Cl. .................................. 331/111; 307/228; 307/276; 307/597; 331/108 D; 331/179; 331/61

[58] Field of Search ............. 307/275, 276, 303, 597, 307/228; 331/111, 108 C, 179, 108 D, 61

[56] References Cited

U.S. PATENT DOCUMENTS

| | | | |
|---|---|---|---|
| 3,668,534 | 6/1972 | Perry, Jr. | 307/276 |
| 4,047,057 | 9/1977 | Ahmed | 307/273 |
| 4,048,590 | 9/1977 | Dobberpuhl | 307/303 |
| 4,147,996 | 4/1979 | Gontowski, Jr. | 331/111 |

FOREIGN PATENT DOCUMENTS

| | | | |
|---|---|---|---|
| 2072448 | 9/1981 | United Kingdom | 331/111 |
| 2072446 | 9/1981 | United Kingdom | 331/111 |

*Primary Examiner*—Stanley D. Miller
*Assistant Examiner*—B. P. Davis

[57] ABSTRACT

An integrated circuit includes provision for connecting to a discrete capacitor, a charger current-mirror circuit for charging the capacitor and a discharger current-mirror circuit for discharging the capacitor. A constant current source is alternately switched to the input branches, respectively, of the charger and discharger circuits. The discharger circuit is made up of an output transistor and an input diode, the latter being connected into the circuit by means of an external link that may be in place to generate a triangle waveform or removed to generate a sawtooth waveform.

2 Claims, 3 Drawing Figures

ALTERABLE MODE OSCILLATOR

BACKGROUND OF THE INVENTION

This invention relates to an alterable mode-oscillator and more particularly to a precision oscillator capable of generating in one mode a triangular wave and in another mode a sawtooth wave. Both kinds of voltage waveforms are used in a variety of circuits, e.g., in pulse width modulators, with voltage controlled oscillators for generating distinctive audible alarm signals, and in circuits for cathode ray tube scanning, etc.

It is known to charge a capacitor in an oscillator from a current source. Such an oscillator is described in my patent U.S. Pat. No. 4,147,996 issued Apr. 3, 1979 assigned to the same assignee as is the present invention.

It is an object of the present invention to provide a precision oscillator that is capable of operating in a triangle waveform mode and a sawtooth waveform mode.

It is a further object of this invention to provide such an oscillator having an integrated circuit portion and a discrete capacitor, wherein a switched constant current source periodically and alternately charges and discharges the capacitor when operating in the triangle waveform mode.

SUMMARY OF THE INVENTION

An alterable mode oscillator includes a capacitor that is charged by a constant current source to provide a precise linear ramp of voltage across the capacitor. Also included is a means for shunting and discharging the capacitor in either one of two operational modes. When a conductive link connects a p-n junction diode in parallel and in the same polarity with the base emitter junction of an output transistor, a first operational mode is effected. A sinking or discharger current-mirror circuit is formed thereby. The transistor is connected through a resistor, collector to emitter, across the capacitor. An oscillating switching means alternately directs a current from a constant current source to the input branch of the charger current-mirror circuit and to the base of the output transistor. Thus when the link is in place, a triangular waveform is produced. When the link is removed, the output transistor is driven much harder, the discharge rate is much faster, and a sawtooth waveform is produced.

Such an oscillator may include a capacitor and an integrated circuit. Such an integrated circuit may be mass produced in anticipation of a wide variety of uses.

DESCRIPTION OF THE PREFERRED EMBODIMENT

Figures 1, 2, 3:
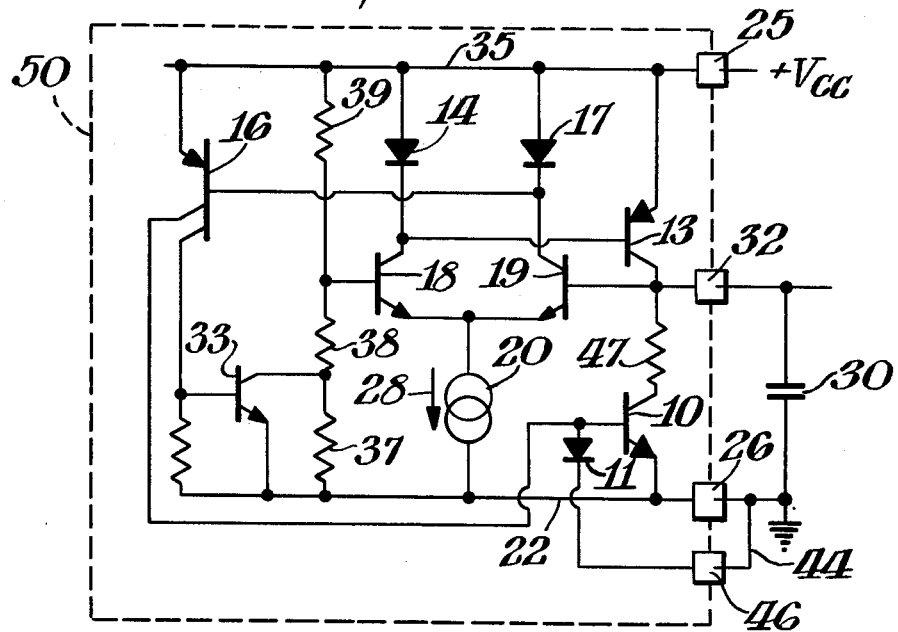
FIG. 1 shows a circuit diagram of an alterable mode oscillator of this invention.
FIG. 2 shows a triangle voltage waveform that may be produced at the output of the oscillator of FIG. 1.
FIG. 3 shows a sawtooth voltage waveform that may be produced at the output of the oscillator of FIG. 1.

With reference to FIG. 1 the description of the oscillator will be helped by recognizing that there appear three current-mirror circuits, namely a first made up of transistor 10 and diode 11, a second made up of transistor 13 and diode 14 and a third made up of transistor 16 and diode 17. The diodes, 11, 14 and 17 in each current-mirror circuit represent an input device in the input branch for which the corresponding transistors 10, 13 and 16, respectively, are the output transistors in the output branches of the current-mirror circuits.

In a current-mirror circuit, the output current at the collector of the output transistor (e.g. 13) is directly related to the input current caused to flow through the input device (e.g. diode 14), as the ratio of junction area of the base-emitter in the output transistor (13) over the junction area of the input device (14). The gain controlling junction area ratios in each of these three current-mirror circuits will preferably be unity, and a unity current "gain" will be assumed in the following discussion of the circuit operation.

A pair of transistors 18 and 19 are arranged in differential amplifier configuration with a current source 20 connected from their emitters to the ground buss 22. Current-mirror input-branch diodes 14 and 17 serve as collector loads for transistors 18 and 19, respectively. When a positive DC supply voltage is first applied to terminal 25 relative to ground terminal 26, transistor 18 turns on to switch the current 28 from current source 20 through diode 14. A capacitor 30 connected to terminals 32 and 26, having zero initial charge holds transistor 19 off. Since at that first instant diode 14 conducts, then so does transistor 13 and a capacitor charging current is produced in the collector of transistor 13 that equals current 28. To complete the picture, at the first instant of turning on the power supply voltage, since transistor 19 and diode 17 are not conducting, neither are transistor 16, transistor 33, diode 11 and transistor 10.

During this first operating interval, when the capacitor 30 charges to a voltage that is greater than the voltage at the base of transistor 18, that is determined by the voltage divider consisting of resistors 37, 38 and 39, then transistor 19 turns on. This leads to turning on transistors 16, 33 and 10, to begin a second operating interval.

In the second interval, transistor 33 shorts out resistor 37 lowering the voltage at the base of transistor 18 between resistors 38 and 39. This causes transistor 13 to turn off. Capacitor 30 is discharged at a rate exactly equal that to which it was charged in the previous operating interval. The rates of charge and discharge are thus equal in this embodiment, both being determined by the magnitude of current 28. This produces across terminals 32 and 26 a precisely symmetrical triangle (isosceles) waveform 42 seen in FIG. 2.

The second operating interval terminates when the voltage across capacitor 30 drops to a value about equal to the low bias voltage at the junction of bias resistors 38 and 39, with resistor 37 substantially shorted by transistor 33. The third operating interval then begins with all transistors in the same state as for the first interval.

Thus far in the description of operation of the oscillator of FIG. 1, it has been assumed that the conductive link 44 connects together terminals 26 and 46. Now consider that when link 44 is removed the diode 11 is no longer in the circuit and the current (equal in value to that of current 28) at the base of transistor 10 is increased one or two orders of magnitude during intervals for which capacitor 30 is being discharged. This high base current will practically insure that transistor 10 saturates and only resistor 47 will limit the discharge current. The value of resistor 47 is preferably much less than that for which the voltage drop that would be developed there-across with a current 28 flowing there-through equals the supply voltage Vcc. This also insures a fast exponential discharge rate (i.e. time constant of resistor 47 and capacitor 30) compared to the charge rate (current 28 divided by value of capacitor 34). On the other hand, the resistance of resistor 47 must be high enough to prevent destructively high currents from flowing in transistor 10, when a sawtooth waveform 49, as illustrated in FIG. 3, is being generated. It also insures that, with link 44 in place for generating a triangle waveform e.g. 42, the presence of resistor 47 has no substantial influence on the discharge rate.

The portion of the circuit of FIG. 1 that is shown within the broken line is preferably formed in a silicon integrated circuit 50 wherein the terminals take the form of metal film termination pads. Thus a DC supply (not shown) will be connected to pads 25 and 26; a discrete capacitor will be connected between pads 25 and 32 and the link 44 may or may not be connected between pads 46 and 26 depending upon the uses to which the oscillator will be put.

If the integrated circuit 50 is to be housed in a leaded package that will subsequently be connected into a system, e.g. by mounting in a printed wire board, the link 44 may build into the printed wiring pattern. If both oscillating modes are required, then a switch may be used external to the integrated circuit 50.

It will be appreciated that the integrated circuit portion of the alterable mode oscillator of this invention may be made in large quantities in anticipation of a great variety of service functions. Not only are precision triangle and sawtooth voltage waveforms available, but by minor additions, not illustrated, another termination pad connected to for example the base of transistor 33 will provide a square voltage waveform, and yet another pad connected to a third emitter of transistor 16 will provide a square current waveform. In addition the length of the time intervals may be changed by changing the value of the capacitor 30 and/or by changing the magnitude of the DC supply voltage, Vcc. In the later case, the amplitude of the voltage waveforms may be varied also.

What is claimed is:

1. An alterable mode oscillator comprising:
   a capacitor;
   a pair of DC power supply busses;
   a charger current-mirror circuit having an output branch connected in a series circuit with said capacitor which series circuit is connected between said pair of DC supply busses;
   a discharger current-mirror circuit having a series connected output branch comprising a resistor and an output transitor, said output branch being connected in parallel with said capacitor;
   a constant current source means for producing a constant value DC current;
   an oscillating switching means for alternately directing said constant current to the input branches of said charger and discharger current-mirror circuits, respectively, so that in a first operating mode, the ratio of the rates of charging to discharging of said capacitor is determined by the magnitude of said current from said constant current source and the area of the paralleled junctions of said current-mirror circuits; and
   a mode changing means for disconnecting in said discharging current-mirror circuit the reference p-n junction of said output transistor so that when said constant current is directed to the input branch of said discharger current-mirror circuit, said output transistor is driven harder and the increased rate of discharge of said capacitor tends to be exponential with time constant equal to the RC product of said resistor and capacitor.

2. An integrated circuit for use in an alterable mode oscillator comprising:
   (a) a silicon substrate; and formed with said substrate,
   (b) a pair of DC power supply terminal pads;
   (c) a pair of output terminal pads one of which is one of said pair of DC supply pads;
   (d) a charger current-mirror circuit having an output branch connected between the other of said output pads and the other of said DC power supply pads;
   (e) a discharger circuit having an output branch comprising an output transistor and a resistor connected in series with said output transistor collector-to-emitter, said output branch being connected in parallel with said output terminal pads;
   (f) an intermediate current-mirror circuit having an output branch connected to the base of said output transistor;
   (g) a constant current source means for producing a constant DC current;
   (h) an oscillating switching means for, in cooperation with a capacitor that may be connected across said output terminal pads, alternately directing said constant current to the input branches, respectfully, of said charger current-mirror-circuit and of said intermediate current-mirror circuit so that, in a first operating mode, the ratio of the rates of charging to discharging of said capacitor is determined by the magnitude of said current from said constant current source and the area of the paralleled junctions of said current-mirror circuits;
   (i) a mode changing circuit terminal pad; and
   (j) a p-n junction diode connected between the base of said output transistor and said mode circuit pad to form a discharger current-mirror circuit comprised of said output transistor and said diode when a conductive link connects said mode circuit pad to said one DC terminal pad.

* * * * *